United States Patent [19]

DiMondi

[11] Patent Number: 4,568,134
[45] Date of Patent: Feb. 4, 1986

[54] PRINTED CIRCUIT BOARD KEYING SYSTEM

[75] Inventor: Vincent D. DiMondi, Camp Hill, Pa.

[73] Assignee: E. I. Du Pont de Nemours and Company, Wilmington, Del.

[21] Appl. No.: 703,656

[22] Filed: Feb. 21, 1985

[51] Int. Cl.$^4$ .......................................... H01R 13/645
[52] U.S. Cl. .............................. 339/17 LC; 339/186 M
[58] Field of Search .......... 339/17 C, 17 LC, 17 LM, 339/17 M, 17 R, 184 R, 184 M, 186 R, 186 M

[56] References Cited

U.S. PATENT DOCUMENTS

| | | | |
|---|---|---|---|
| 2,944,240 | 7/1960 | Barber | 339/64 |
| 3,582,867 | 6/1971 | Thompson et al. | 339/92 |
| 3,588,784 | 6/1971 | Kunkle et al. | 339/65 |
| 3,611,272 | 10/1971 | Fairbairn et al. | 339/184 M |
| 4,224,486 | 9/1980 | Zimmerman et al. | 200/51.1 |
| 4,277,126 | 7/1981 | Lincoln | 339/186 M |
| 4,350,409 | 9/1982 | Kato et al. | 339/186 M |
| 4,376,565 | 3/1983 | Bird et al. | 339/186 M |
| 4,398,779 | 8/1983 | Ling | 339/17 LC |
| 4,435,031 | 3/1984 | Black et al. | 339/17 C |

FOREIGN PATENT DOCUMENTS 0033286 8/1981 European Pat. Off. .

OTHER PUBLICATIONS

IBM Technical Disclosure Bulletin, vol. 15, No. 2, pp. 624-625 (Jul. 1972), C. R. Pettie.
IBM Technical Disclosure Bulletin, vol. 21, No. 2, pp. 519-521, Jul. 1978, M. W. Bombara et al.

*Primary Examiner*—Neil Abrams

[57] ABSTRACT

Incorrect pairing of subsidiary printed circuit boards on opposite sides of a main circuit board is prevented by providing a key or orientation insert on each subsidiary circuit board which projects more than half way through an aperture in the main circuit board. Only subsidiary circuit boards with orientation inserts that complement one another in the main circuit board aperture can be mounted opposite one another on the main circuit board.

16 Claims, 6 Drawing Figures

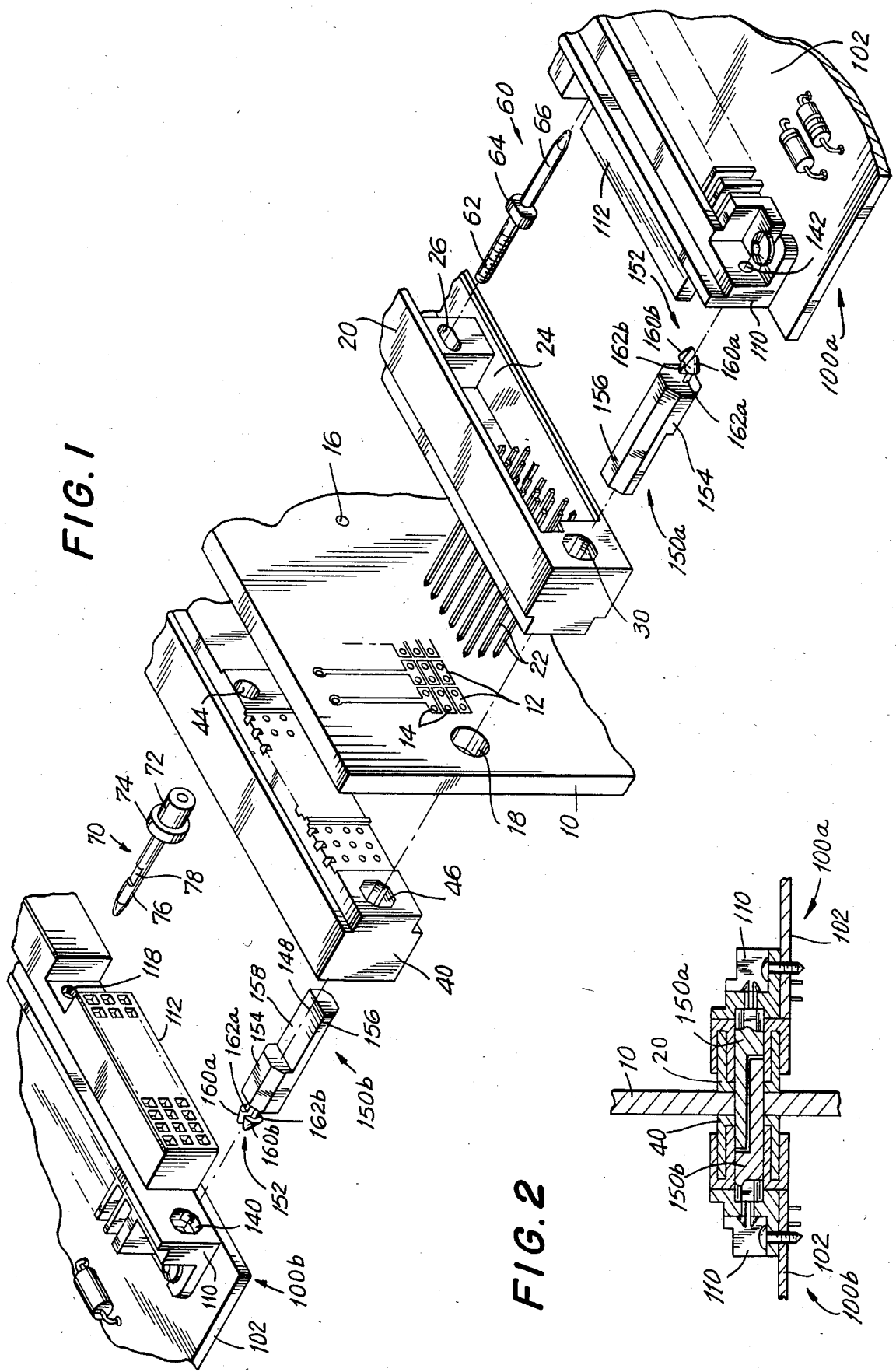

PRINTED CIRCUIT BOARD KEYING SYSTEM

BACKGROUND OF THE INVENTION

This invention relates to apparatus for ensuring that electrical circuit boards (e.g., printed circuit boards or "PCBs") are connected to one another only in the intended manner in order to prevent erroneous interconnection of possibly incompatible circuit boards.

There is increasing interest in PCB configurations in which subsidiary PCBs (sometimes known as "daughter boards") are connected on both sides of a main PCB (sometimes known as the "mother board"). This configuration may be used to render the PCB configuration more compact, thereby shortening the circuit paths in the apparatus and allowing the apparatus to operate at greater speed.

It is often desirable in such PCB configurations to ensure that the daughter boards on opposite sides of the mother board are compatible with one another without regard for the location of the daughter boards on the mother board. This may be important to prevent erroneous circuit operation and/or damage to the circuitry.

It is therefore an object of this invention to provide apparatus for ensuring that daughter boards on opposite sides of a mother board are compatible with one another without regard for the location of the daughter boards relative to the mother board.

It is another object of this invention to provide apparatus for preventing daughter boards from being mounted on opposite sides of a mother board except in intended, compatible pairs.

SUMMARY OF THE INVENTION

These and other objects of the invention are accomplished in accordance with the principles of the invention by providing at least one key or orientation insert member on each daughter board for mating with the corresponding orientation insert of only those daughter boards which are compatible with the first daughter board. Each daughter board orientation insert is a longitudinal member whose cross section adjacent one end is one lateral half of a closed geometric shape (e.g., a regular polygon) which is preferably symmetrical about the longitudinal axis of the insert. (As used herein, the term "regular polygon" means a polygon which is equilateral and equiangular.) The other end of the orientation insert is mounted on the daughter board, preferably by means which allow the laterally bisected end portion to have any one of several angular orientations about the longitudinal axis of the insert. When a first daughter board is mounted on the mother board, the laterally bisected end of the orientation insert on the daughter board extends into an aperture which passes all the way through the mother board. Only a second daughter board having an orientation insert with a laterally bisected end portion which is oriented so that it exactly complements the laterally bisected end portion of the first daughter board insert can be mounted on the mother board opposite the first daughter board. Any non-complementary orientation insert on the second daughter board will not fully enter the mother board aperture (or will push the first daughter board insert out of the aperture), thereby preventing incorrectly paired daughter boards from being mounted opposite one another on the mother board.

Further features of the invention, its nature and various advantages will be more apparent from the accompanying drawings and the following detailed description of the invention.

BRIEF DESCRIPTION OF THE DRAWINGS

FIG. 1 is an exploded perspective view of part of a mother board and two daughter boards constructed in accordance with the principles of this invention and depicting a first illustrative embodiment of the invention.

FIG. 2 is a sectional view through the assembled apparatus of FIG. 1. The plane of the paper in FIG. 2 is mutually perpendicular to the planes of the mother and daughter boards. The longitudinal axes of orientation inserts 150a and 150b also lie in the plane of the paper in FIG. 2.

DETAILED DESCRIPTION OF THE INVENTION

Figure 3:
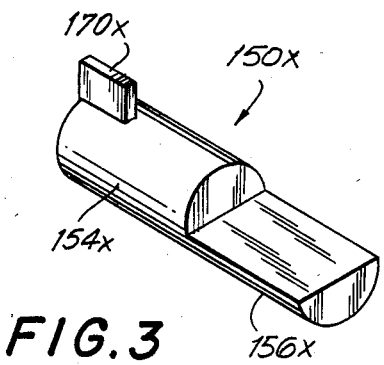
FIG. 3 is a perspective view of an alternative embodiment of the orientation insert of this invention.

As shown in FIG. 1, typical mother board 10 includes conventional electrical circuit traces 12 and other circuit elements (not shown) in any desired arrangement. Header 20 is mounted on one side of mother board 10 so that terminal pins 22 pass through apertures 14 in the mother board and project out the opposite side of the mother board. Shroud 40 fits on the projecting portions of pins 22 so that the pins project through the shroud into a recessed or socket portion of the shroud similar to socket portion 24 of header 20.

Elements 10, 20, and 40 may be secured together by means of two-part metal guide pin assembly 60 and 70. In particular, one part 60 of the guide pin assembly has a male threaded end portion 62, an intermediate outwardly extending flange portion 64, and an opposite tapered end portion 66. Threaded end portion 62 extends through aligned apertures 26, 16, and 44 in elements 20, 10, and 40, respectively. The end of aperture 26 remote from mother board 10 is enlarged to receive flange portion 64. Flange portion 64 and the corresponding portion of aperture 26 have an oblong cross sectional shape to prevent rotation of pin 60 relative to header 20. The other part 70 of the guide pin assembly includes female threaded end portion 72, intermediate outwardly extending flange portion 74, and opposite tapered end portion 76. Female threaded end portion 72 fits into shroud aperture 44 and is threaded onto male threaded end portion 62. Tapered end portion 76 includes two diametrically opposite flats 78 (only one of which is visible in FIG. 1) to facilitate rotation of guide pin 70 by means of a wrench during joining of pins 60 and 70. The diameter of flange portion 74 is larger than the diameter of the portion of aperture 44 closest to mother board 10. Accordingly, when pins 60 and 70 are threaded together, elements 10, 20, and 40 are held together between flanges 64 and 74.

A first daughter board 100a can be plugged into header 20 for electrical contact, via pins 22, with mother board 10 and/or a second daughter board 100b similarly plugged into shroud 40. Each daughter board 100 includes a receptacle 110 mounted on the edge of the daughter board substrate 102. Each receptacle 110 has an aperture 118 for receiving tapered end portion 66 or 76 of pin 60 or 70. Thus, in addition to securing elements 10, 20, and 40 together as described above, pins 60 and 70 cooperate with apertures 118 during connection of daughter boards 100 to mother board 10 to help guide receptacle nose portions 112 into header and shroud sockets 24, and to help guide pins 22 into receptacles 110. After connection of boards 10 and 100, guide pins 60 and 70 help support daughter boards 100 relative to mother board 10. In view of the structural and reinforcing functions performed by pins 60 and 70, those members are preferably made of a relatively strong material such as stainless steel.

Adjacent to at least one end of each daughter board receptacle 110 is a key or orientation insert member 150a or 150b which projects from the associated daughter board toward mother board 10. (It should be noted that orientation inserts 150a and 150b are preferably identical to one another, as is the case in the depicted embodiment.) The end portion 156 of each orientation insert remote from the associated daughter board has a cross section which is one lateral half of a closed geometric shape that is preferably symmetrical about the midpoint of the line dividing the two lateral halves of that shape. (Axis 148 passes through that midpoint.) Although in the depicted embodiment the cross section of end portion 156 is one lateral half of a regular octagon, many other cross sectional shapes are also suitable. For example, the cross section of end portion 156 could be one lateral half of any of the following illustrative closed geometric shapes: a circle, an elipse, a square, a rectangle, a regular hexagon, a six pointed star with sides of equal length and equal apex angles, etc. Orientation inserts 150 are preferably made of a relatively rigid thermoplastic material such as nylon.

The other end of each orientation insert 150 is firmly secured to the associated daughter board 100 by any suitable means, preferably by means which allow the orientation insert to be positioned with any one of several angular orientations about a longitudinal axis 148 which passes through the above-described midpoint of the line dividing the two lateral halves of the above-mentioned closed geometric shape. Most preferably the orientation insert mounting means defines two or more discrete angular orientations for the associated orientation insert 150, each of which discrete angular orientations is 180° from another of the discrete angular orientations. For example, in the depicted embodiment, the end portion 154 of each orientation insert 150 remote from end portion 156 (ignoring for the moment latching elements 160 and 162) is a regular octagon concentric with longitudinal axis 148. Octagonal end portion 154 fits in similarly sized and shaped socket 140 in daughter board receptacle 110. Accordingly, each orientation insert 150 can be mounted on the associated daughter board 100 with any of eight discrete angular orientations relative to longitudinal axis 148. In each of these discrete angular orientations, the sides of octagonal end portion 154 are parallel to the adjacent sides of octagonal socket 140.

Figure 4:
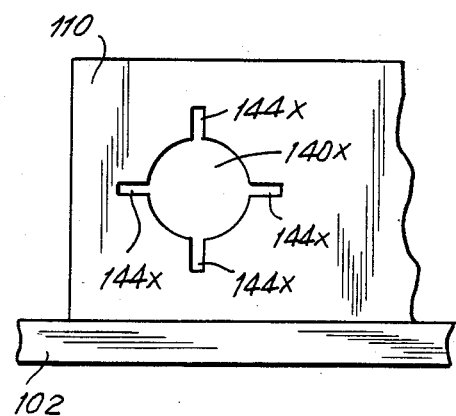
FIG. 4 is an elevational view of a portion of a daughter board with which the orientation insert of FIG. 3 can be used.
Figure 5:
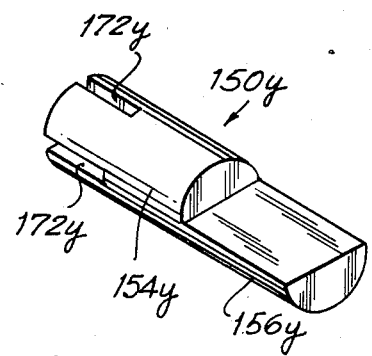
FIG. 5 is a perspective view of another alternative embodiment of the orientation insert of this invention.
Figure 6:
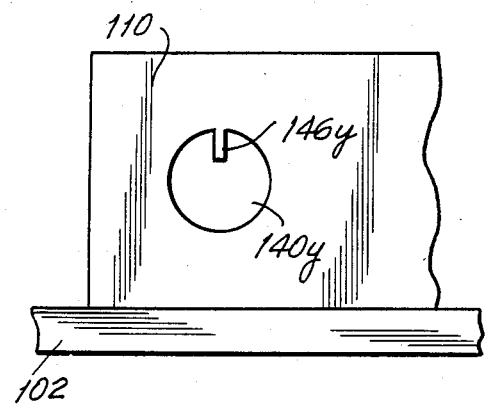
FIG. 6 is an elevational view of a portion of a daughter board with which the orientation insert of FIG. 5 can be used.

Other complementary shapes could be used on orientation inserts 150 and receptacles 110 to provide the above-described plurality of discrete angular orientations for inserts 150. For example, FIG. 3 shows a basically cylindrical orientation insert 150x having a tab 170x extending radially outward from one side of cylindrical end portion 154x. End portion 154x fits in cylindrical socket 140x (FIG. 4) having a plurality of diametrically opposite keyways 144x, any one of which can receive tab 170x. (The other end portion 156x of orientation insert 150x is a semi-cylinder analogous to semi-polygonal end portion 156 of orientation insert 150a or 150b in FIGS. 1 and 2.) FIGS. 5 and 6, which are respectively similar to FIGS. 3 and 4, illustrate that a functionally identical result can be achieved by providing a radially inwardly projecting tab 146y in otherwise cylindrical daughter board socket 140y, and a plurality of radially inwardly extending slots 172y in the cylindrical end portion 154y of orientation insert 150y. Any of slots 172y can receive tab 146y, thereby defining a plurality of discrete angular orientations of orientation insert 150y in socket 140y. Other examples of cross sectional shapes which can be used to provide several discrete angular orientations of an orientation insert in a socket as described above are the following: an elipse (two discrete angular orientations), a rectangle (two discrete angular orientations), a square (four discrete angular orientations), a regular hexagon (six discrete angular orientations), a six pointed star having equal sides and equal apex angles (six discrete angular orientations), etc.

Although various means such as glue, screws, or rivets can be used to secure orientation inserts 150 to associated daughter board receptacles 110, in the depicted embodiment latches 152 are used for this purpose. Each latching structure 152, which is coaxial with longitudinal axis 148, comprises two laterally spaced semi-conical members 160a and 160b, each of which is connected to the remainder of the associated orientation insert 150 by a transversely resilient finger 162a or 162b. The semi-conical surfaces of members 160 are synclinal in the direction away from the remainder of insert 150. The transverse cross section of each finger 162 is substantially smaller than the adjacent base of the associated semi-conical member 160, and each finger 162 is set in from the semi-circular portion of the periphery of that base. It should also be noted that the bases of semi-conical members 160 are collectively smaller than the adjacent end of orientation insert portion 154.

Each socket 140 has a smaller circumference, coaxial extension 142 which extends from the bottom of the socket through the remainder of the associated receptacle 110. The axial length of extension 142 is slightly less than the length of fingers 162, and the diameter of extension 142 is approximately equal to the distance between (1) the side surface of finger 162a which faces away from finger 162b and (2) the side surface of finger 162b which faces away from finger 162a. Accordingly, when an orientation insert 150 is pressed into socket 140 with the sides of intermediate portion 154 aligned with the sides of the socket, semi-conical members 160 deflect toward one another in order to pass through extension 142. After passing through extension 142, semi-conical members 160 tend to return to their original spacing so that the bases of the semi-conical members abut the surface of receptacle 110 which faces away from socket 140, thereby latching orientation insert 150 in socket 140. Latching elements 142 and 152 are effective to latch orientation insert 150 in socket 140 in any of the possible angular orientations of the insert.

Considering now the mounting of daughter boards 100 (with orientation inserts 150 latched in place as described above) on mother board 10, when daughter board 100a is plugged into header 20, orientation insert 150a on that daughter board passes through aligned apertures 30 and 18 in header 20 and mother board 10, respectively, and the laterally bisected portion 156 of that insert enters shroud aperture 46. When orientation insert 150a is in this position in shroud aperture 46, only a daughter board 100b having an orientation insert 150b whose angular orientation is exactly 180° different from the angular orientation of orientation insert 150a can be plugged into shroud 40. If orientation insert 150b has that angular orientation, then the laterally bisected portion 156 of orientation insert 150b can enter shroud aperture 46, mother board aperture 18, and header aperture 30 parallel to the laterally bisected portion 156 of orientation insert 150a as shown in FIG. 2. The large, flat, axial surfaces 158 on the two orientation inserts are face to face, and the laterally bisected portions 156 of the two orientation inserts exactly complement one another. On the other hand, if orientation insert 150b has any angular orientation other than the one in which it is 180° out of phase with orientation insert 150a, then the laterally bisected portions 156 of the two orientation inserts will interfere with one another in aligned apertures 30, 18, and 46, and it will not be possible to plug both daughter boards 100 into mother board 10 at the same time. Preferably this interference between misaligned laterally bisected portions 156 prevents more than one of the associated daughter boards from making electrical contact with pins 22 at any one time. The apparatus of this invention therefore prevents incorrectly paired daughter boards 100 from being plugged in on opposite sides of mother board 10.

Each orientation insert 150 is long enough so that when the associated daughter board 100 is fully plugged into mother board 10, the orientation insert extends more than half way through aligned apertures 30, 18, and 46 (i.e., through and beyond the plane of mother board 10), but less than all the way through those aligned apertures. This assures that if two opposing orientation inserts are not properly aligned with one another, the interference between those inserts will occur before both daughter boards 100 are fully plugged into mother board 10, preferably before both daughter boards can make electrical contact with pins 22 and/or with one another. Also, when each daughter board 100 is fully plugged into mother board 10, the laterally bisected portion 156 of the associated orientation insert 150 extends at least as far on the side of mother board 10 adjacent that daughter board as it extends on the side of mother board 10 remote from that daughter board. This assures that if the laterally bisected portions 156 of two orientation inserts are 180° out of phase with one another (and therefore complement one another in aligned apertures 30, 18, and 46), the free end of each laterally bisected portion 156 will not abut the adjacent end of the remainder of the other insert before both of the associated daughter boards are fully plugged into mother board 10.

Although the drawings show only one end of the receptacle 110 on each daughter board 100 (and only one orientation insert 150 on each daughter board), it will be understood that another orientation insert 150 could be provided adjacent the other end of each receptacle if desired. Still other orientation inserts 150 could be provided at other points along the length of each receptacle 110. Aligned apertures 30, 18, and 46 are required at each orientation insert site. At each orientation insert site, the orientation inserts on oppositely mounted daughter boards must be exactly 180° out of phase with one another in order to permit both daughter boards to be plugged in. Accordingly, increasing the number of orientation insert sites greatly increases the number of combinations available to preclude daughter boards from being incorrectly paired on opposite sides of a mother board. For example, with one octagonal orientation insert on each daughter board, there are one compatible and seven incompatible orientation insert orientations on daughter board 100b for each of the eight possible orientation insert orientations on daughter board 100a. If two octagonal orientation inserts are provided on each daughter board, then there are collectively 64 possible orientations of the two orientation inserts on daughter board 100a; and for each of those 64 combined insert orientations, there are one compatible and 63 incompatible orientations of the two inserts on daughter board 100b.

It should also be noted that, although only one guide pin assembly 60 and 70 is shown in the drawings, other similar assemblies can be located elsewhere along header 20 and shroud 40 to increase the number of points at which those elements are secured to mother board 10, as well as the number of points at which daughter boards 100 are guided and supported by guide pin assemblies.

I claim:

1. Apparatus for ensuring correct pairing of two subsidiary electrical circuit board assemblies on opposite sides of a main electrical circuit board assembly comprising:

an aperture through the main circuit board assembly between the two subsidiary circuit board assemblies along an axis perpendicular to the plane of the main circuit board assembly; and an orientation insert member mounted on each subsidiary circuit board assembly for projection into the aperture coaxial with the axis of the aperture, the end portion of each insert remote from the associated subsidiary circuit board assembly having a transverse cross section which is one lateral half of a closed geometric shape which is symmetrical about the axis of the aperture, said end portion of each insert projecting more than half way through the aperture when the associated subsidiary circuit board assembly is mounted on the main circuit board assembly so that both inserts can fully enter the aperture without interfering with one another only if said end portions of the inserts are oriented so that their transverse cross sections are complementary halves of the closed geometric shape.

2. The apparatus defined in claim 1 further comprising:

means for mounting each insert on the associated subsidiary circuit board assembly so that the insert has any one of a plurality of discrete angular orientations about the longitudinal axis of the insert.

3. The apparatus defined in claim 2 wherein each of the discrete angular orientations is diametrically opposite another one of the discrete angular orientations.

4. The apparatus defined in claim 2 wherein the means for mounting comprises a socket in each subsidiary circuit board assembly for receiving the second end of an insert opposite said end portion of said insert.

5. The apparatus defined in claim 4 wherein each socket and the second end of each insert include complementary surface features for defining said plurality of discrete angular orientations in which an insert can be inserted into a socket.

6. The apparatus defined in claim 5 wherein each of the discrete angular orientations is diametrically opposite another one of the discrete angular orientations.

7. The apparatus defined in claim 6 wherein the cross section of the second end of each insert is a regular polygon, and wherein each socket is the same regular polygon sized so that the second end of an insert will fit in the socket only when the adjacent sides of the insert polygon and the socket polygon are parallel.

8. The apparatus defined in claim 7 wherein the regular polygon has an even number of sides.

9. The apparatus defined in claim 8 wherein the regular polygon is an octagon.

10. The apparatus defined in claim 1 wherein the closed geometric shape is a regular polygon.

11. The apparatus defined in claim 10 wherein the polygon has an even number of sides.

12. The apparatus defined in claim 11 wherein the polygon is an octagon.

13. The apparatus defined in claim 10 wherein the portion of each insert adjacent the associated subsidiary circuit board assembly has a transverse cross section which is the polygon.

14. The apparatus defined in claim 13 wherein the portion of each insert adjacent the associated subsidiary circuit board assembly is mounted in a correspondingly shaped socket in the subsidiary circuit board assembly.

15. The apparatus defined in claim 14 wherein each insert and socket include complementary latch means for latching the insert in the socket when the insert is pushed into the socket with any angular orientation in which the sides of the polygon of the insert are parallel to the sides of the polygon of the socket.

16. The apparatus defined in claim 1 further comprising:
    means associated with the main circuit board assembly for making electrical contact with each of the subsidiary circuit board assemblies when each subsidiary circuit board assembly is mounted on the main circuit board assembly, said end portion of each insert projecting far enough into the aperture to prevent the electrical contact means from simultaneously making electrical contact with both subsidiary circuit board assemblies unless said end portions of the inserts are oriented so that their transverse cross sections are complementary halves of the closed geometric shape.

* * * * *